(12) United States Patent
Wang et al.

(10) Patent No.: US 12,437,909 B2
(45) Date of Patent: Oct. 7, 2025

(54) DISPLAY SCREEN AND DISPLAY SCREEN FRAME

(71) Applicant: UNILUMIN GROUP CO., LTD, Shenzhen (CN)

(72) Inventors: Zhao Wang, Shenzhen (CN); Aiwu Wang, Shenzhen (CN); Weiqiang Zhu, Shenzhen (CN); Yunfei Wen, Shenzhen (CN); Zhinan Wang, Shenzhen (CN)

(73) Assignee: UNILUMIN GROUP CO., LTD., Shenzhen (CN)

( * ) Notice: Subject to any disclaimer, the term of this patent is extended or adjusted under 35 U.S.C. 154(b) by 296 days.

(21) Appl. No.: 17/956,620

(22) Filed: Sep. 29, 2022

(65) Prior Publication Data

US 2023/0019566 A1    Jan. 19, 2023

Related U.S. Application Data

(63) Continuation of application No. PCT/CN2021/101123, filed on Jun. 21, 2021.

(30) Foreign Application Priority Data

Jul. 2, 2020  (CN) .......................... 202010628287.8

(51) Int. Cl.
*H01F 7/02* (2006.01)
*H05K 5/02* (2006.01)
*H05K 5/30* (2025.01)

(52) U.S. Cl.
CPC ............. *H01F 7/0252* (2013.01); *H01F 7/02* (2013.01); *H05K 5/0217* (2013.01); *H05K 5/30* (2025.01)

(58) Field of Classification Search
CPC ...... H05K 5/0021; H05K 5/0217; H01F 7/02; H01F 7/0252; F16B 5/00; F16B 2200/83; G09F 9/00
(Continued)

(56) References Cited

U.S. PATENT DOCUMENTS 7,864,514 B2 *   1/2011   Lee .................... F16M 13/02
                                                      362/225
8,505,860 B2 *   8/2013   Schluter ............. F16M 11/24
                                                      248/287.1
(Continued)

FOREIGN PATENT DOCUMENTS

CN     201286199 Y     8/2009
CN     201853441 U     6/2011
(Continued)

OTHER PUBLICATIONS

First Office Action issued in counterpart Chinese Patent Application No. 202010628287.8, dated Apr. 24, 2022.
(Continued)

*Primary Examiner* — Kimberly T Wood
(74) *Attorney, Agent, or Firm* — Westbridge IP LLC

(57) ABSTRACT

Disclosed are a display screen and a display screen frame. The display screen includes a display screen frame and a plurality of display modules, the display screen frame includes a plurality of profile rods, the plurality of profile rods are distributed at a preset distance interval, an open slot on a same side surface of each profile rod is provided with a magnetic adsorption piece, and the display module is fixed on the magnetic adsorption piece.

9 Claims, 11 Drawing Sheets

(58) Field of Classification Search
USPC .............. 40/1, 605; 248/683, 206.5, 309.4,
248/220.21, 220.22, 221.11, 223.41,
248/224.51, 224.61, 223.21, 225.11;
361/807
See application file for complete search history.

(56) References Cited

U.S. PATENT DOCUMENTS

| | | | | |
|---|---|---|---|---|
| 9,015,974 | B2* | 4/2015 | Valentine | ............... G09F 1/10 40/600 |
| 10,636,334 | B2* | 4/2020 | Entwistle | ............. G09F 9/3026 |
| 11,436,954 | B2* | 9/2022 | Houlihan | ............ G09F 15/0062 |
| 2018/0350277 | A1 | 12/2018 | Entwistle | |

FOREIGN PATENT DOCUMENTS

| CN | 201976363 | U | | 9/2011 |
|---|---|---|---|---|
| CN | 202749049 | U | | 2/2013 |
| CN | 203325374 | U | * | 12/2013 |
| CN | 203325376 | U | | 12/2013 |
| CN | 106297571 | A | | 1/2017 |
| CN | 106463083 | A | | 2/2017 |
| CN | 107134227 | A | | 9/2017 |
| CN | 107492314 | A | | 12/2017 |
| CN | 208507131 | U | | 2/2019 |
| CN | 109404382 | A | | 3/2019 |
| CN | 109448572 | A | | 3/2019 |
| CN | 110335550 | A | | 10/2019 |
| CN | 110675762 | A | | 1/2020 |
| CN | 210183669 | U | | 3/2020 |
| CN | 210349210 | U | | 4/2020 |
| CN | 210722219 | U | | 6/2020 |
| CN | 111681571 | A | | 9/2020 |
| CN | 212305938 | U | | 1/2021 |
| CN | 212305939 | U | | 1/2021 |
| CN | 212365392 | U | | 1/2021 |
| CN | 212484828 | U | | 2/2021 |
| CN | 212624675 | U | | 2/2021 |
| GB | 2287348 | A | | 9/1995 |
| KR | 930600 | B1 | * | 12/2009 |
| WO | 2020022692 | A1 | | 1/2020 |

OTHER PUBLICATIONS

International Search Report and Written Opinion issued in corresponding PCT Application No. PCT/CN2021/101123, dated Sep. 1, 2021.

Second Office Action issued in counterpart Chinese Patent Application No. 202010628287.8, dated Oct. 31, 2022.

* cited by examiner

DISPLAY SCREEN AND DISPLAY SCREEN FRAME

CROSS-REFERENCE TO RELATED APPLICATIONS

This application is a continuation application of International Application No. PCT/CN2021/101123, filed on Jun. 21, 2021, which claims priority to Chinese Patent Application No. 202010628287.8, filed on Jul. 2, 2020. The disclosures of the above-mentioned applications are incorporated herein by reference in their entireties.

TECHNICAL FIELD

The present disclosure relates to the technical field of displays, and in particular to a display screen and a display screen frame.

BACKGROUND

Nowadays, a display screen includes a plurality of display modules, a control assembly, a power supply and a cabinet frame. The existing display screen frame is generally processed and molded integrally by sheet metal and stamping equipment, and other accessories are connected with the display screen frame by welding, which makes the existing display screen frame cumbersome, expensive and inconvenient to be assembled.

SUMMARY

The present disclosure provides a display screen, aiming to solve the technical problem that the existing display screen frame is cumbersome, expensive and inconvenient to be assembled.

In order to achieve the above objective, the present disclosure provides a display screen, including a display screen frame and a plurality of display modules, the display screen frame includes a plurality of profile rods, an open slot on a same side surface of each profile rod is provided with a magnetic adsorption piece; and the display module is fixed on the magnetic adsorption piece.

The present disclosure further provides a display screen frame, including a plurality of profile rods and a plurality of support plates for fixing an electrical assembly, and the plurality of profile rods are distributed at a preset distance interval, the same side surface of each profile rod is provided with an open slot for installing and fixing a display module; a side of each support plate is firmly fixed on a lateral slot of the profile rod for installing and fixing at least one electrical assembly.

The present disclosure provides the display screen and the display screen frame. Simple processing is performed on the conventional profile rod, that is, there is no need for secondary processing on the profile rod, and it is possible to just add an extra magnetic adsorption piece on the conventional profile rod. Thus, the profile rod becomes a main structure for supporting the display screen frame of the display modules of the display screen without having a second processing on the profile rod, thus the processing cost is low. Meanwhile, the profile rod is light and can be cut into a needed length according to a screen size, and the profile rod is magnetically fixed on each display module by cooperating with a magnetic adsorption piece. While ensuring the structure of the entire display screen frame is light and convenient for disassembly and maintenance by the installer, it can avoid the problem that the structural deformation of the profile rod will affect the flatness of the display screen caused by the secondary processing of the profile rod. Thus, the technical problem that the existing display screen frame is cumbersome, expensive, and inconvenient to be assembled is effectively solved.

BRIEF DESCRIPTION OF THE DRAWINGS

In order to more clearly illustrate the technical solutions in the embodiments of the present disclosure or in the related art, drawings used in the embodiments or in the related art will be briefly described below. Obviously, the drawings in the following description are only some embodiments of the present disclosure. It will be apparent to those skilled in the art that other figures can be obtained according to the structures shown in the drawings without creative work.

DETAILED DESCRIPTION OF THE EMBODIMENTS

The specific embodiments of the present disclosure will be further described with reference to the accompanying drawings. It should be understood that the specific embodiments described herein are only used to explain the present disclosure, and are not intended to limit the present disclosure. Besides, the technical features mentioned in the following description of embodiments of the present disclosure described below could be combined with each other if they are not contradictory.

Figure 1:
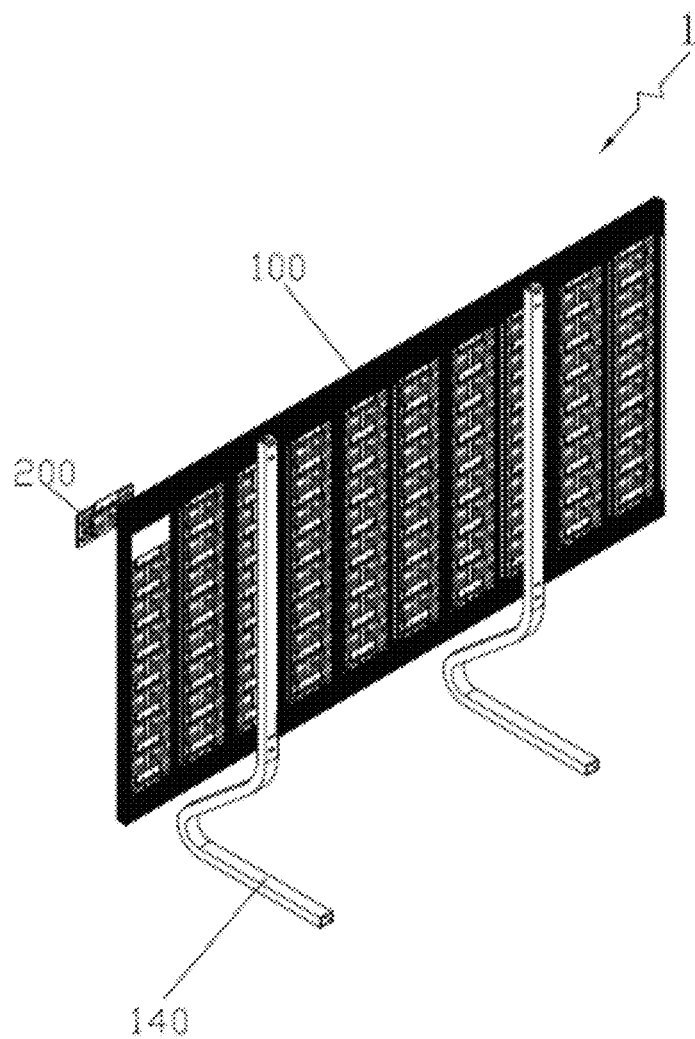
FIG. 1 is a schematic partial structural view of a display screen according to an embodiment of the present disclosure.
Figure 2:
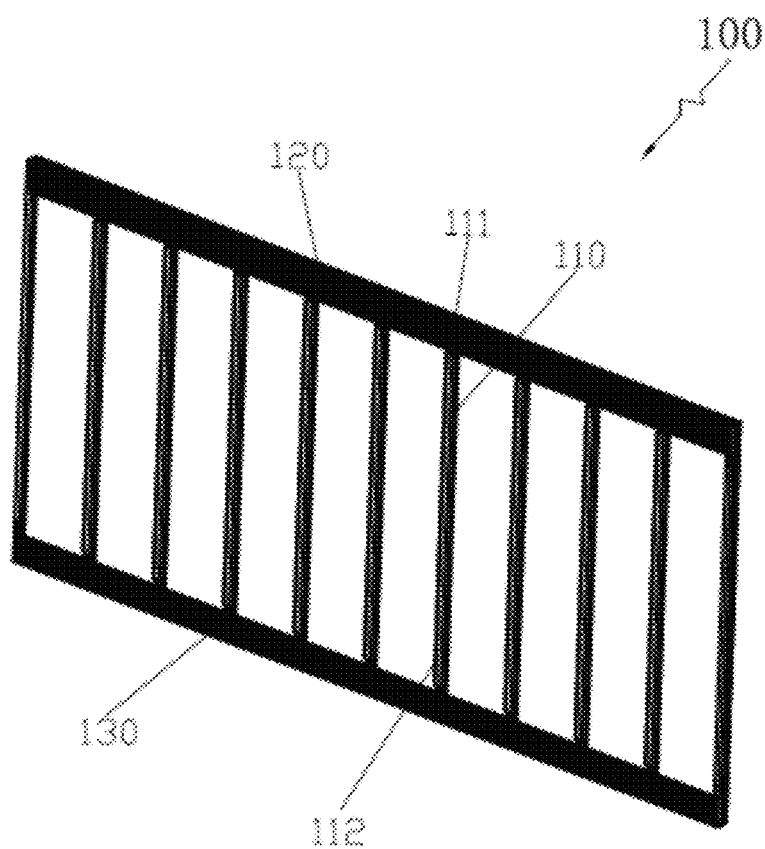
FIG. 2 is a schematic partial structural view of a display screen frame of the display screen in FIG. 1.

As shown in FIG. 1 and FIG. 2, the present disclosure provides a display screen 1. The display screen 1 includes a display screen frame 100 and a plurality of display modules 200. The display screen frame 100 includes a plurality of profile rods 110. The plurality of profile rods 110 are distributed at a preset distance interval. An open slot 111 on a same side surface of each profile rod 110 is provided with a magnetic adsorption piece 112, and the display module 200 is fixed on the magnetic adsorption piece 112.

In this embodiment, as shown in FIG. 1 and FIG. 2, the display screen 1 is not only limited to a light-emitting diode (LED) display screen, that is, the display module 200 may be an LED display module, a liquid crystal display (LCD)

module, an organic light emitting diode (OLED) module or other modules that can be spliced. The profile rod 110 is preferably made of aluminum, which is light and cheap. It can be understood that the profile rod 110 can also be made of steel, plastic, plastic-steel, or any other metal. The profile is an objective with a certain geometry that is made of iron, steel or material with certain strength and toughness by rolling, extrusion, casting and other processes. This kind of material has a certain dimension, a certain section form, and a certain mechanical and physical property. The profile can not only be used independently but also be further processed into other products, and the profile rod 110 is commonly used for building structure and manufacture and installation. The mechanical engineer can select parameters like concrete shape, material, heat treatment state, and mechanical property of the profile rod in accordance with the design requirement, and divide the profile into the required size and shape, then further process or perform heat treatment on the profile to meet the precision requirement of design.

As shown in FIG. 2, the plurality of profile rods 110 in this embodiment are spaced apart from each other. The display screen frame 100 further includes a top crossbeam rod 120 and a bottom crossbeam rod 130. Top sides of the plurality of profile rods 110 are connected by the top crossbeam rod 120, and bottom sides of the plurality of profile rods 110 are connected by the bottom crossbeam rod 130. To facilitate the installation and fixing of the top crossbeam rod 120 and the bottom crossbeam rod 130, the up and lower ends of each profile rod 110 will be milled into two notches by a milling cutter, and the two notches can be fitted with the top crossbeam rod 120 and the bottom crossbeam rod 130, such that the top crossbeam rod 120 and the bottom crossbeam rod 130 may be embedded into the profile rod 110, which makes the whole display screen having no obvious protruding structure, therefore the display screen can be completely installed against a wall). That is, in this embodiment, all of the profile rods 110 extend longitudinally, and in accordance with the different installation positions, the plurality of profile rods 110 located in the middle can be used as a stand column of the display screen frame 100, and two profile rods 110 located at the edges of both sides can be used as side columns of the display screen frame 100. The profile rod 110 used as a side column of the display screen frame 100 is half the width of the profile rod 110 used as a stand column of the display screen frame 100. The top crossbeam rod 120 is the top beam of the display screen frame 100, and the bottom crossbeam rod 130 is the bottom beam of the display screen frame 100. The upper and lower ends of the stand column and the side column are respectively installed on the top beam and the bottom beam, thus the top beam and the bottom beam provide an installation reference surface for installing the stand column and the side column, and the plurality of profile rods 110 are transversely spaced apart from each other. A border type of the display screen frame 100 can be chosen in accordance with an actual type (including a type with border and a type without border) of a display screen 1, i.e., setting a border on the top crossbeam rod 120, the bottom crossbeam rod 130 and the side column. When the display module 200 is completely out of positioning and only subjected to an adsorption force, the border can be a limiter and a benchmark.

As shown in FIG. 2, both of the top crossbeam rod 120 and the bottom crossbeam rod 130 are two-segment folding structure or multi-segment folding structure, which facilitates a folding transportation and a storage of the whole display screen frame 100. As shown in FIG. 1, the display screen frame 100 in this embodiment further includes a floor type installation bracket 140 enabling the floor type installation of the display screen 1. Meanwhile, depending on an actual installation condition, the bracket accessories corresponding to the display screen 1 can also be replaced to support a movable installation, a wall-hang installation, an embedded installation, a pulley-type installation, a hang-type installation, a two-sided installation and so on.

Figure 3:
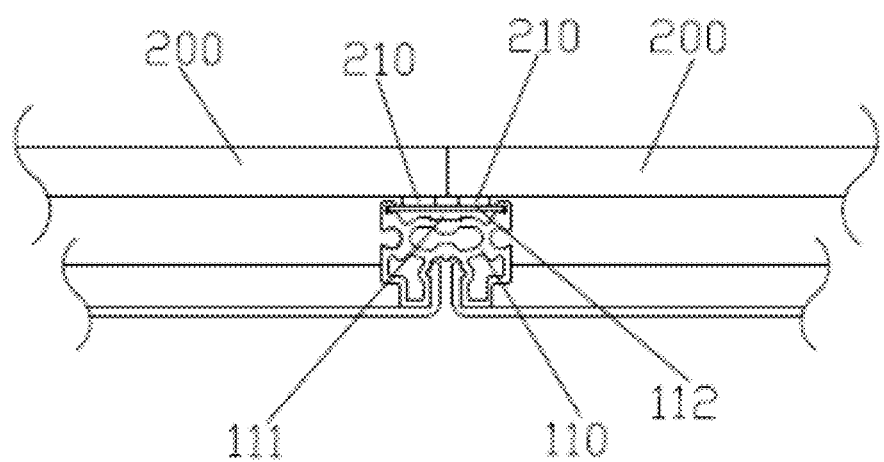
FIG. 3 is a schematic structural view of a single slot of the display screen frame in FIG. 2.
Figure 4:
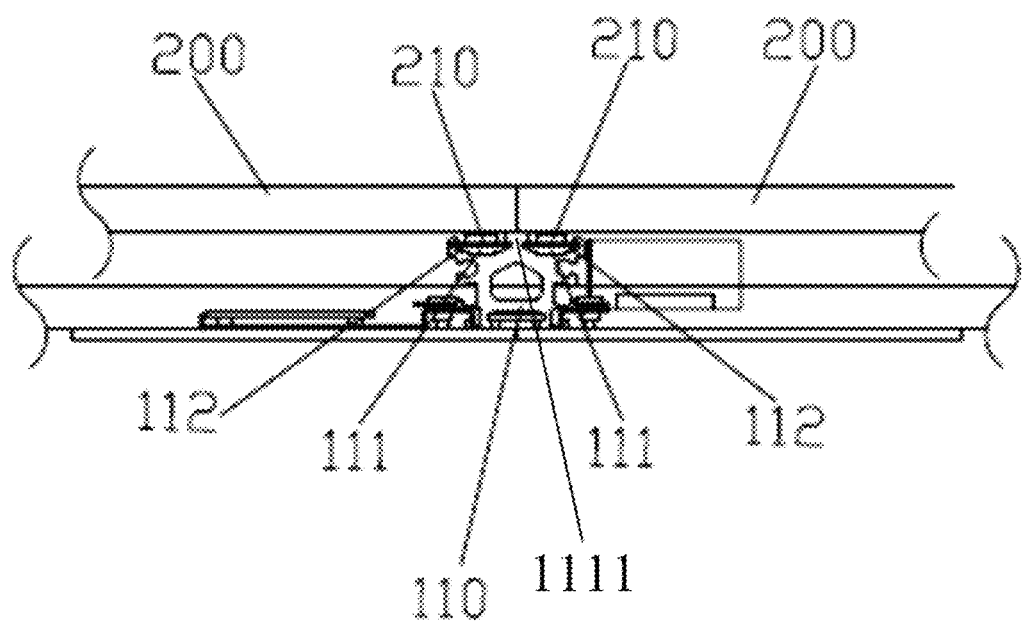
FIG. 4 is a schematic structural view of a dual slot of the display screen frame in FIG. 2.

As shown in FIG. 1 to FIG. 3, the display module 200 in this embodiment uses a generic magnetic adsorption module, i.e., a plurality of magnet blocks 210 are distributed uniformly along a back edge of the display module 200. An open slot 111 on the same side surface of each profile rod 110 is a single slot. As shown in FIG. 3, a magnetic adsorption piece 112 is provided on the open slot 111, and both sides of two adjacent display modules 200 are respectively fixed on the same magnetic adsorption piece 112 by the magnet block 210. The open slot 111 with this kind of structure can only be positioned by a border of the side columns on both sides due to the lack of a reference plane, thus the open slot 111 can also be replaced with a dual slot shown in FIG. 4. A middle of the dual slot is provided with a positioning boss 1111, and a surface of the positioning boss 1111 is in contact with a back of the display module 200. Meanwhile, each open slot 111 includes two parallel slots, each slot is provided with a magnetic adsorption piece 112, and both sides of two adjacent display modules 200 are respectively fixed on the same magnetic adsorption piece 112 by the magnet block 210. Then a reference plane protruding from a middle of the two slots (i.e., a positioning boss 1111) is a position of a splicing gap between the two display modules 200. Then, a direct contact between the reference plane and the splicing gap between the two display modules 200 ensures that the two display modules 200 share a same reference plane, thereby ensuring a flatness when splicing the two display modules 200. Besides, the open slot 111 can further be a multi slot, which includes a plurality of parallel slots, and each slot is provided with the magnetic adsorption piece 112, or only some of the slots are provided with the magnetic adsorption piece 112.

As shown in FIG. 2 and FIG. 3, the magnetic adsorption piece 112 in this embodiment can be a bar ferromagnetic material block which is made of iron, iron alloy, cobalt, cobalt alloy, nickel, nickel alloy or ferrite, and the open slot 111 on a same side surface of each profile rod 110 is respectively embedded with the bar ferromagnetic material block extending in a length direction of the corresponding open slot 111, which means that the bar ferromagnetic material block is contained in the open slot 111, and the magnet block 210 corresponds to the bar ferromagnetic material block to fix the display module 200 by magnetic adsorption. The bar ferromagnetic material block is embedded in the corresponding open slot 111. Each open slot 111 can be provided with the bar ferromagnetic material block extending from one end to another end of the open slot 111. Each open slot 111 can also be provided with the plurality of the bar ferromagnetic material blocks and a sum of lengths of the plurality of the bar ferromagnetic material blocks is shorter than a length of the corresponding open slot 111. Specifically, the bar ferromagnetic material block can be an iron sheet, and the iron sheet is directly embedded into the open slot 111, more specifically, the iron sheet can be fixed on a bottom wall of the open slot 111 by a bonding structure or a welding structure or a buckling structure to prevent the iron sheet from moving up or moving down, and owing to the magnetic adsorption of the iron sheet, as shown in FIG. 3, both sides of two adjacent display modules 200 are fixed on the same iron sheet by the magnet block 210.

Besides, for those skilled in the art, the magnetic adsorption piece 112 can also be improved by using a bar magnet. Due to the magnetism of the bar magnet, a magnet block 210 provided on a back of the display module 200 can be replaced by a ferromagnetic material piece adsorbed by the magnet, and the open slot 111 on a same side surface of each profile rod 110 is respectively embedded with the bar magnet, and the bar magnet extends in a length direction of the corresponding open slot 111, which means that the bar magnet is contained in the open slot 111, and the ferromagnetic material piece 230 corresponds to the bar magnet to fix the display module 200 by magnetic adsorption. The bar magnet is embedded in the corresponding open slot 111. Each open slot 111 can be provided with the bar magnet extending from one end to another end of the open slot 111. Each open slot 111 can also be provided with the plurality of the bar ferromagnetic material blocks and a sum of lengths of the plurality of the bar magnets is shorter than a length of the corresponding open slot 111. Specifically, the bar magnet can be a magnet sheet or a soft magnetic stripe, and the bar magnet is directly embedded into the open slot 111, more specifically, the magnet sheet can be fixed on the bottom wall of the open slot 111 by a bonding structure or a welding structure or a buckling structure to prevent the magnet sheet from moving up or moving down, and owing to the magnetic adsorption of the bar magnet, as shown in FIG. 3, both sides of two adjacent display modules 200 are fixed on the same bar magnet by the magnet block 210.

Figure 5:
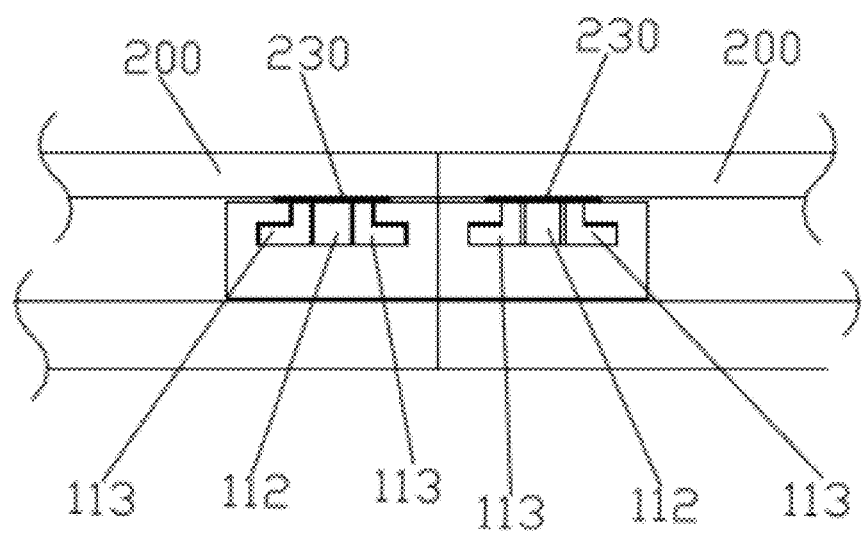
FIG. 5 is a schematic structural view of a bar magnet of the display screen frame in FIG. 2.

Besides, the bar magnet can also be fixed as shown in FIG. 5, that is, two sides of the open slot 111 on the same side surface of each profile rod 110 are embedded with two L-shaped ferromagnetic pieces 113 (preferably an L-shaped iron sheet), and the two L-shaped ferromagnetic pieces 113 extend in the length direction of the corresponding open slot 111, and each bar magnet is clamped between the two L-shaped ferromagnetic pieces 113 of the corresponding open slot 111, namely, two sides of each bar magnet are fixed on the corresponding L-shaped ferromagnetic piece 113, meanwhile the L-shaped ferromagnetic pieces 113 on two sides of the open slot 111 can not only be used for adsorption fixing but can also effectively reinforce a magnetic field of an outer surface of the bar magnet, and the display module 200 can be more firmly attached on the bar magnet through the ferromagnetic material piece 230.

Figure 6:
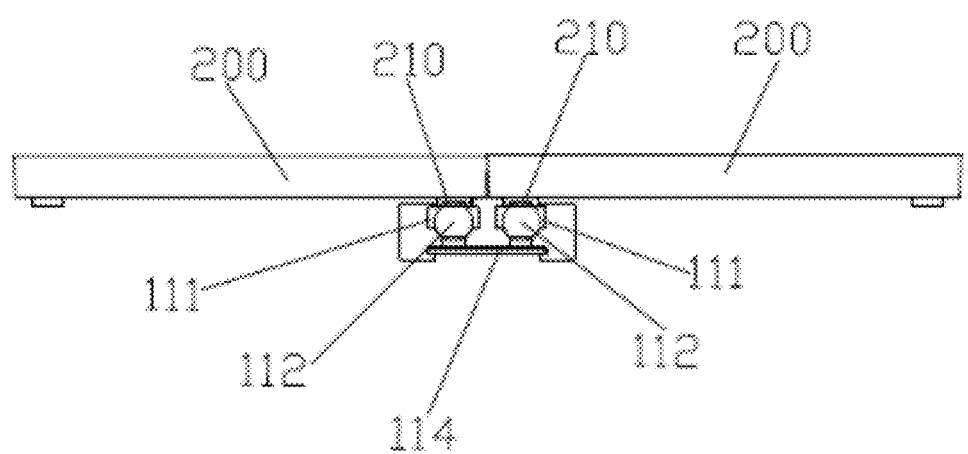
FIG. 6 is a schematic structural view of a magnetic ball of the display screen frame in FIG. 2.

In addition, as shown in FIG. 6, the magnetic adsorption piece 112 can also be a magnetic adsorption fixer, and the open slot 111 on the same side surface of each profile rod 110 is provided with a plurality of magnetic adsorption fixers, and the magnet block 210 corresponds to the magnetic adsorption fixer so as to fix the corresponding display module 200. Specifically, the magnetic adsorption fixer can be a magnetic ball as shown in FIG. 6, and an iron sheet 114 is provided at a back of the bottom wall of the open slot 111. When the magnetic ball slides into the open slot 111, it will continue to roll along the open slot 111. When the magnetic ball rolls to a clamping hole which is a through hole, the magnetic ball will be in a mutual attraction with the iron sheet 114 provided at a back of the open slot 111 through the through hole due to the magnetism of the magnetic ball, so as to be adsorbed at the position of the clamping hole. Both sides of two adjacent display modules 200 are fixed on the corresponding magnetic ball through the magnet block 210. Specifically, the magnetic adsorption fixer can further be a magnetic ring, and each magnetic ring is locked on a bottom wall of the open slot 111 through a countersunk screw so as to correspond to the magnet block 210. Besides, the magnetic adsorption fixer can further be other different types like a spring type, a clasp type, a clip type and so on.

Figure 7:
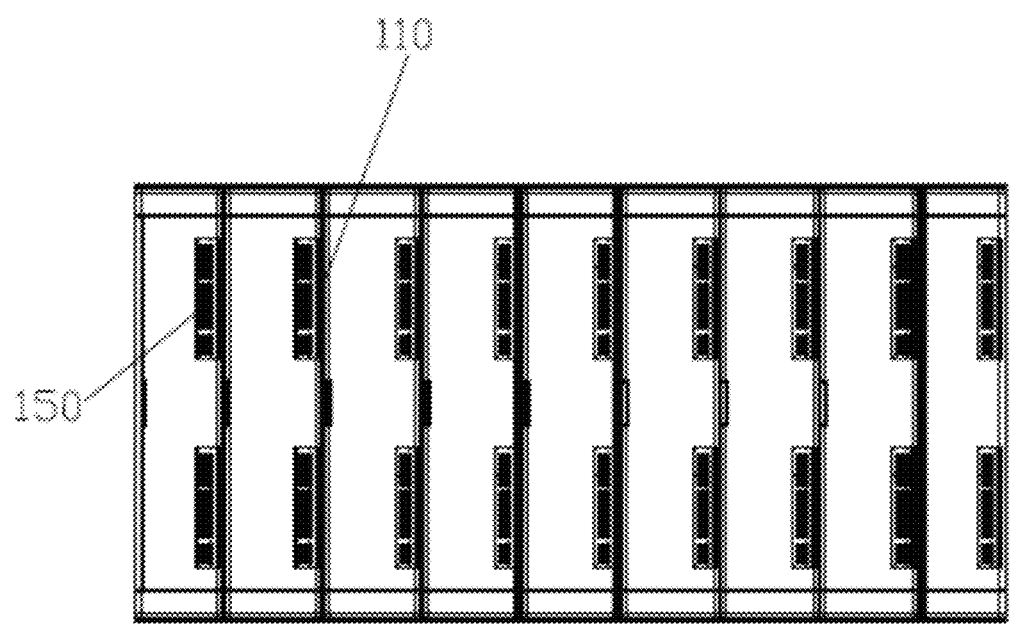
FIG. 7 is another schematic partial structural view of the display screen frame of the display screen in FIG. 1.
Figure 8:
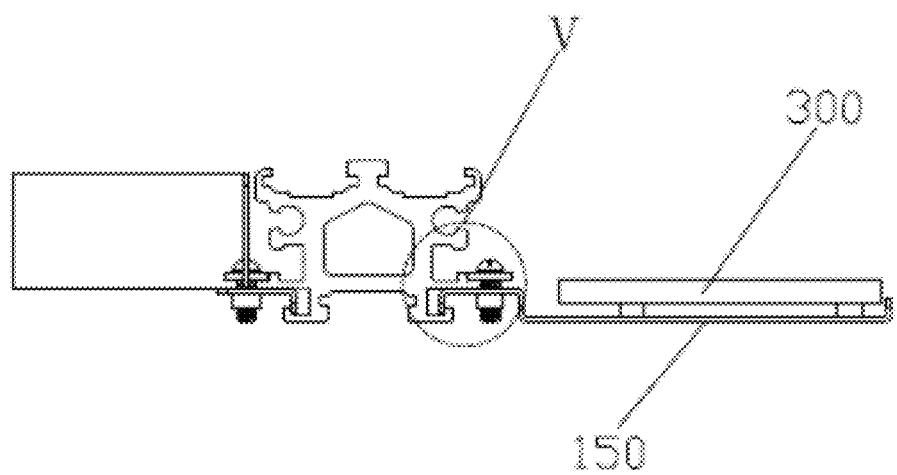
FIG. 8 is a schematic view of assembly of a support plate for fixing an electrical assembly of the display screen frame in FIG. 7.
Figure 9:
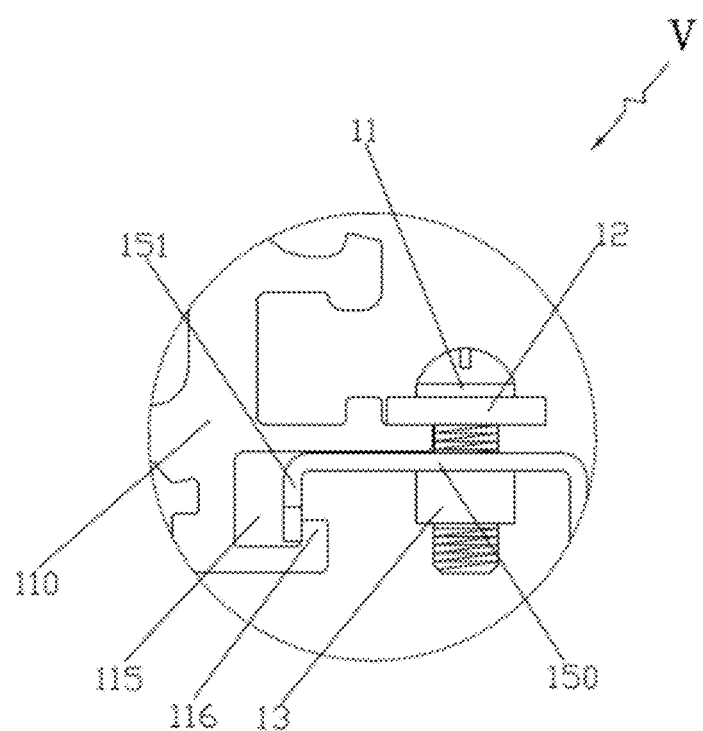
FIG. 9 is an enlarged schematic structural view of portion V in FIG. 8.

As shown in FIG. 7 to FIG. 9, the display screen 1 further includes a plurality of electrical assemblies 300, a side of the electrical assembly 300 can directly be fastened on a lateral slot on another side of the profile rod 110. The side of the electrical assembly 300 can also be fastened in following ways, that is, the display screen frame 100 further includes a plurality of support plates 150, a side of each support plate 150 is fastened on a lateral slot 115 of the profile rod 110 and each support plate 150 is fixed with at least one electrical assembly 300. Each electrical assembly 300 includes a hub plate, a power module, and a receiving card for ensuring a normal working of the display screen 1. The support plate 150 is a sheet metal and can be clamped on a stand column (that is the lateral slot 115 of any of the profile rod 110) by a clamping structure, then there is no need for an extra tooling processing to the sheet metal. As shown in FIG. 8 and FIG. 9, a side of the support plate 150 is matched with a clamping plate 12 to clamp a side edge of the lateral slot 115, and a side of the support plate 150 is firmly connected with the clamping plate 12 by a combination of the plurality of screws and nuts (each combination includes a screw 11 and a nut 13). It is also understandable that, a side of the support plate 150 is matched with a clamping block to clamp a side edge of the lateral slot 115, and a side of the support plate 150 is firmly connected with the clamping block by a combination of the screws and nuts (each combination includes a screw 11 and a nut 13). To ensure a firm connection, a side edge of the lateral slot 115 is provided with a first hook portion 116, and the side of the support plate 150 is further provided with a second hook portion 151 being in a tight-fit lock with the first hook portion 116 to firmly position the sheet metal (that is, the support plate 150) without processing. A corresponding routing design is needed after the plurality of electrical assemblies 300 is fixed, thus a corresponding hole or section can be provided on the crossbeam, the stand column and the border for routing. Meanwhile, except from being cooperated with the crossbeam, two end notches of the stand column mentioned above is further reserving an allowance for routing.

Figure 10:
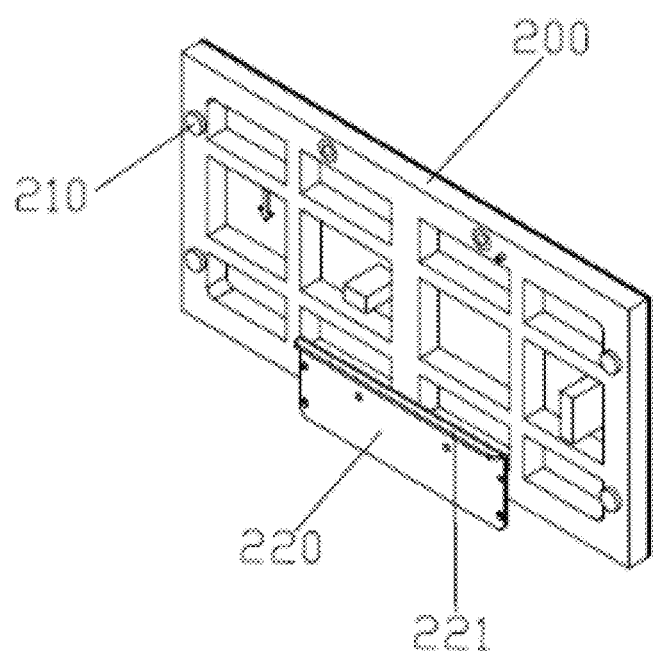
FIG. 10 is a schematic structural view of a display module of the display screen in FIG. 1.
Figure 11:
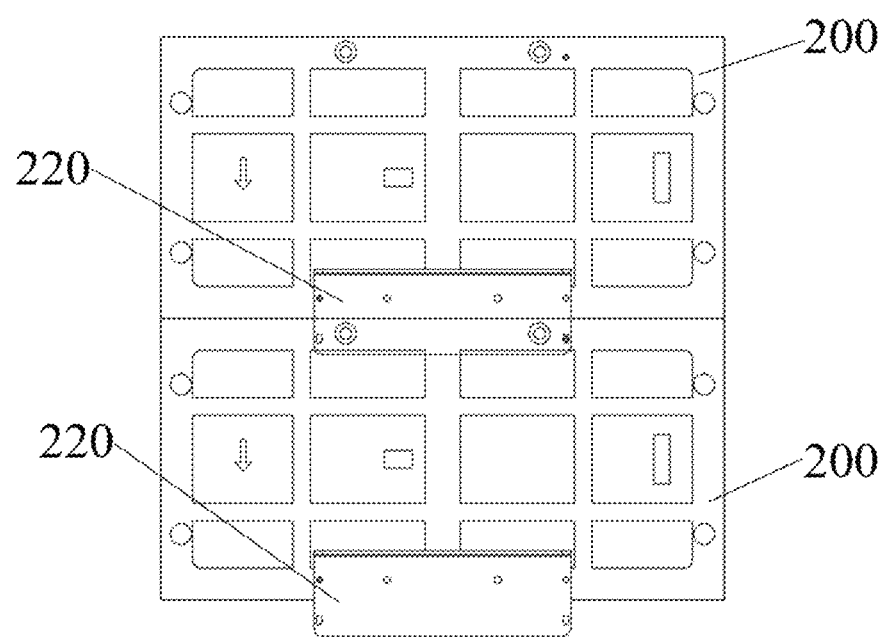
FIG. 11 is another schematic structural view of the display module of the display screen in FIG. 1.

As shown in FIG. 10 and FIG. 11, a back of each display module 200 is fixed with a magnetic adsorption leveling plate 220, a first display module 200 is magnetically fixed on the magnetic adsorption leveling plate 220 of a second display module 200 adjacent to the first display module 200, and both a back of the first display module 200 and a back of the second display module 200 are flush with a surface of a same magnetic adsorption leveling plate 220. Specifically, the magnetic adsorption leveling plate 220 is close to a top or a bottom of the corresponding display module 200. When each display module 200 is magnetically fixed, the magnetic adsorption leveling plate 220 can be used as a leveling base plate of the two longitudinally adjacent display modules 200 for ensuring the flatness of the two display modules 200 spliced together. A reinforcing rib 221 is also provided on the surface of one side of the magnetic adsorption leveling plate 220 away from the corresponding display module 200. Since the display module 200 is easily heating when working, a swelling deformation of the display module 200 is prone to be occurred, the support of the magnetic adsorption leveling plate 220 for the display module 200 and the setting of the reinforcing rib 221 can effectively alleviate this phenomenon.

The embodiments of the present disclosure have been described in detail above with reference to the accompanying drawings, but the present disclosure is not limited to the described embodiments. For those skilled in the art, without departing from the principles and spirit of the present disclosure, the various changes, modifications, substitutions and alteration made to the embodiments will still fall within the scope of the present disclosure.

What is claimed is:

1. A display screen, comprising:
a display screen frame; and
a plurality of display modules;
wherein the display screen frame comprises a plurality of profile rods, an open slot on a same side surface of each profile rod is provided with a magnetic adsorption piece, and the plurality of display modules are fixed on the magnetic adsorption piece;
wherein a back of each display module is fixed with a magnetic adsorption leveling plate, a first display module is magnetically fixed on the magnetic adsorption leveling plate of a second display module adjacent to the first display module, and both a back of the first display module and a back of the second display module are flush with a surface of a same magnetic adsorption leveling plate.

2. The display screen of claim 1, wherein the open slot is a dual slot, a middle of the dual slot is provided with a positioning boss, and a surface of the positioning boss is in contact with a back of the display module.

3. The display screen of claim 1, wherein the magnetic adsorption piece is a bar ferromagnetic material block, and the open slot on the same side surface of each profile rod is embedded with the bar ferromagnetic material block extending in a length direction of a corresponding open slot.

4. The display screen of claim 1, wherein the magnetic adsorption piece is a bar magnet, and the open slot on the same side surface of each profile rod is embedded with the bar magnet extending in a length direction of a corresponding open slot.

5. The display screen of claim 4, wherein two sides of the open slot on the same side surface of each profile rod are embedded with two L-shaped ferromagnetic pieces extending in the length direction of the corresponding open slot, and each bar magnet is provided between the two L-shaped ferromagnetic pieces of the corresponding open slot.

6. The display screen of claim 1, wherein the magnetic adsorption piece is a magnetic adsorption fixer, the open slot on the same side surface of each profile rod is provided with a plurality of magnetic adsorption fixers, and each magnetic adsorption fixer corresponds to a magnetic point of the display module.

7. The display screen of claim 1, wherein the plurality of profile rods are distributed at a preset distance interval along a side of the display screen frame.

8. The display screen of claim 1, wherein the display screen frame further comprises a top crossbeam rod and a bottom crossbeam rod, top sides of the plurality of profile rods are connected by the top crossbeam rod, and bottom sides of the plurality of profile rods are connected by the bottom crossbeam rod.

9. The display screen of claim 1, further comprising:
a plurality of electrical assemblies, each electrical assembly being firmly fixed on a lateral slot of each profile rod,
wherein the display screen frame further comprises a plurality of support plates for fixing the plurality of electrical assemblies, and a side of each support plate is firmly fixed on the lateral slot of each profile rod for installing and fixing at least one electrical assembly.

* * * * *